(12) United States Patent
Yamada

(10) Patent No.: US 9,041,424 B2
(45) Date of Patent: May 26, 2015

(54) INTERFACE AND APPARATUS FOR INSPECTING ELECTRICAL CHARACTERISTICS OF WAFER

(71) Applicant: Tokyo Electron Limited, Tokyo (JP)

(72) Inventor: Hiroshi Yamada, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 299 days.

(21) Appl. No.: 13/706,805

(22) Filed: Dec. 6, 2012

(65) Prior Publication Data

US 2013/0147506 A1    Jun. 13, 2013

(30) Foreign Application Priority Data

Dec. 8, 2011   (JP) .................................. 2011-268673
Feb. 28, 2012  (JP) .................................. 2012-041555

(51) Int. Cl.
  *G01R 31/02*   (2006.01)
  *G01R 31/26*   (2014.01)
  *G01R 1/04*    (2006.01)
  *G01R 31/28*   (2006.01)

(52) U.S. Cl.
  CPC .......... *G01R 1/0491* (2013.01); *G01R 31/2874* (2013.01); *G01R 31/2886* (2013.01)

(58) Field of Classification Search
  CPC .......... G01R 31/2886; G01R 31/2887; G01R 31/2891; G01R 31/2889; G01R 1/0491; G01R 1/07378; G01R 31/2863; G01R 31/2875; G01R 31/2893; G01R 31/2601; G01R 31/2851; G01R 31/2865; G01R 31/2884; G01R 1/0408; G01R 31/28; G01R 31/2874

See application file for complete search history.

(56) References Cited

U.S. PATENT DOCUMENTS

| 6,373,271 B1 * | 4/2002 | Miller et al. ............. 324/750.14 |
| 6,791,347 B2 * | 9/2004 | Ishizaka et al. .......... 324/750.05 |
| 2003/0112002 A1 * | 6/2003 | Kawaguchi et al. ....... 324/158.1 |
| 2011/0062979 A1 | 3/2011 | Umemura |
| 2011/0095780 A1 | 4/2011 | Nakata |

FOREIGN PATENT DOCUMENTS

| JP | 07-037945 A | 2/1995 |
| JP | 07-161788 A | 6/1995 |
| JP | 10-321686 A | 12/1998 |
| JP | 11-238770 A | 8/1999 |
| JP | 2002-110751 A | 4/2002 |
| JP | 2007-306010 A | 11/2007 |
| JP | 2010-207224 A | 9/2010 |

* cited by examiner

*Primary Examiner* — Vinh Nguyen
(74) *Attorney, Agent, or Firm* — Pearne & Gordon LLP

(57) ABSTRACT

The wafer inspection interface 18 includes a probe card 20 having a multiple number of probes 25; a fixing ring 21 configured to hold the probe card 20; a chuck top 23 disposed to face the probe card 20 with a wafer W therebetween; an outer seal ring 24 provided to hermetically seal an outer space 27 surrounded by the fixing ring 21, the probe card 20 and the chuck top 23; an outer depressurization path 29 through which the outer space 27 is depressurized; an inner seal ring 26 provided to hermetically seal an inner space 28 surrounded by the probe card 20 and the wafer W; and an inner depressurization path 30 through which the inner space 28 is depressurized. Further, the inner space 28 may be surrounded by the outer space 27, and the wafer W is disposed within the inner space 28.

11 Claims, 9 Drawing Sheets

FIG. 1
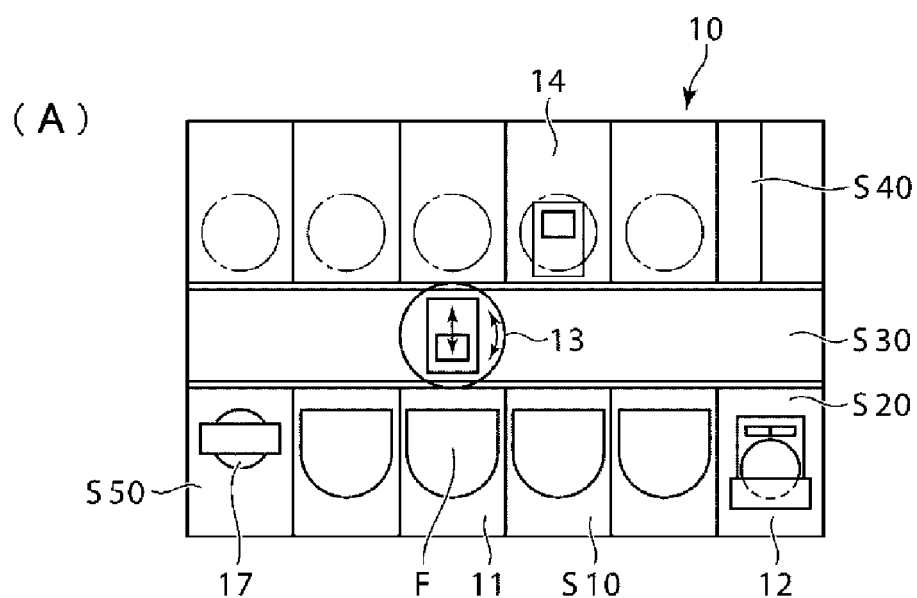
(A)
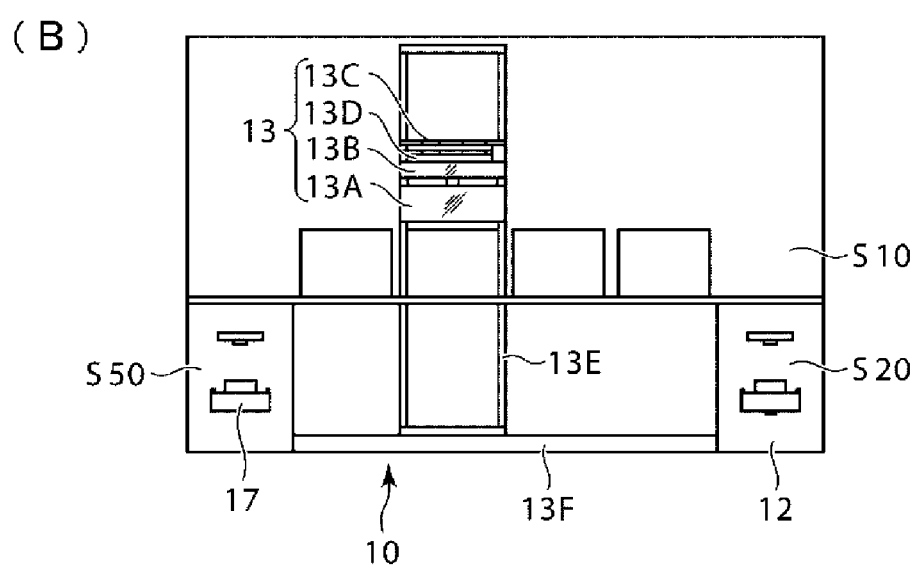
(B)

FIG. 4
(A)
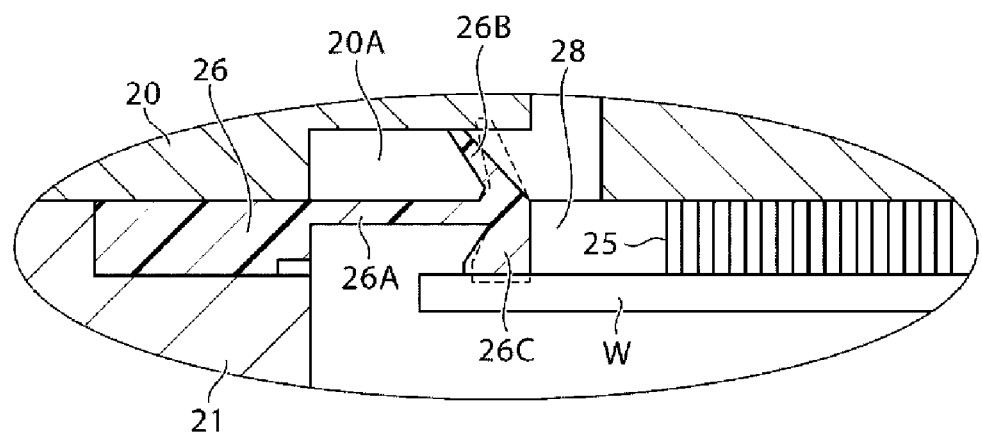
(B)
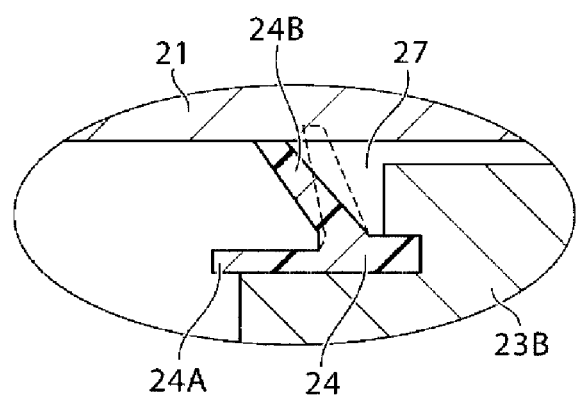

FIG. 5
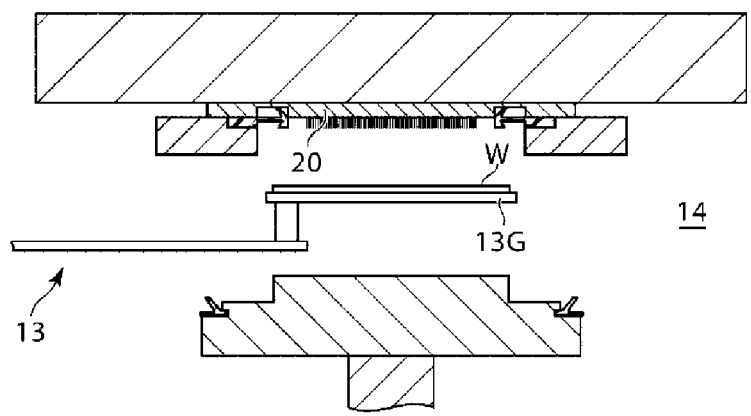
(A)
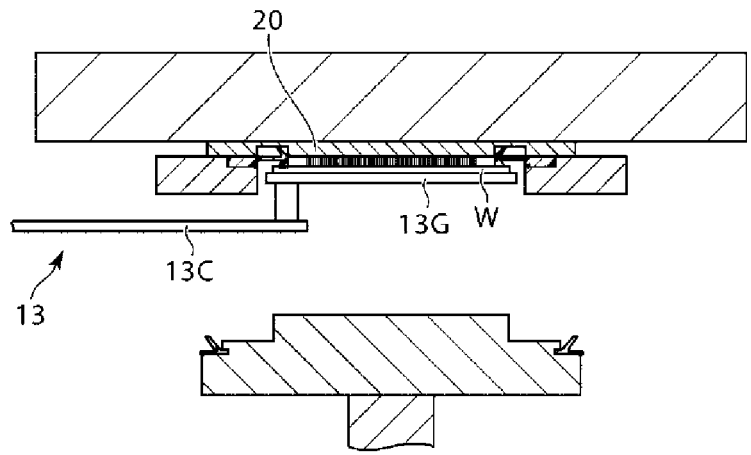
(B)
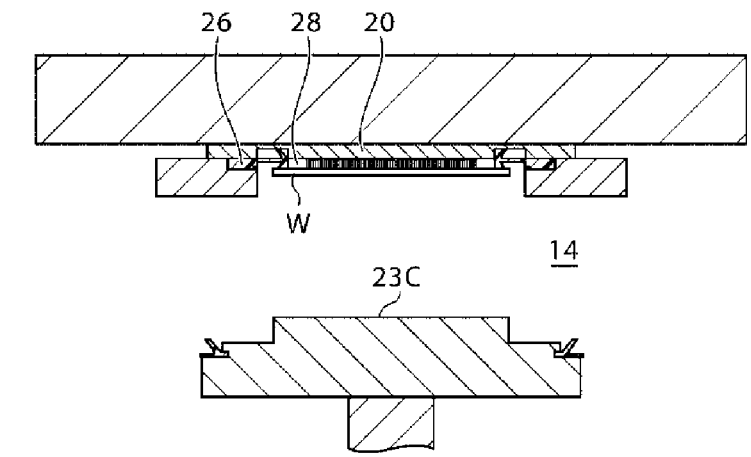
(C)

FIG. 6
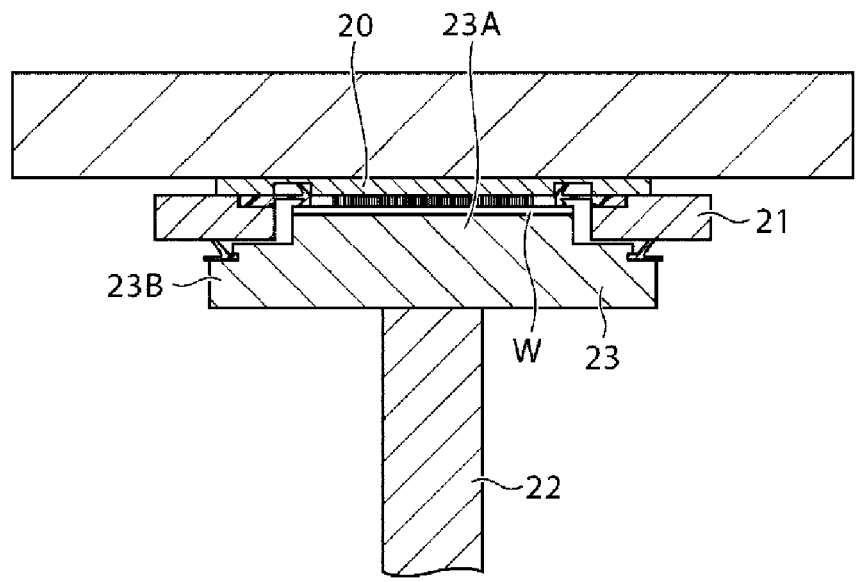
(A)
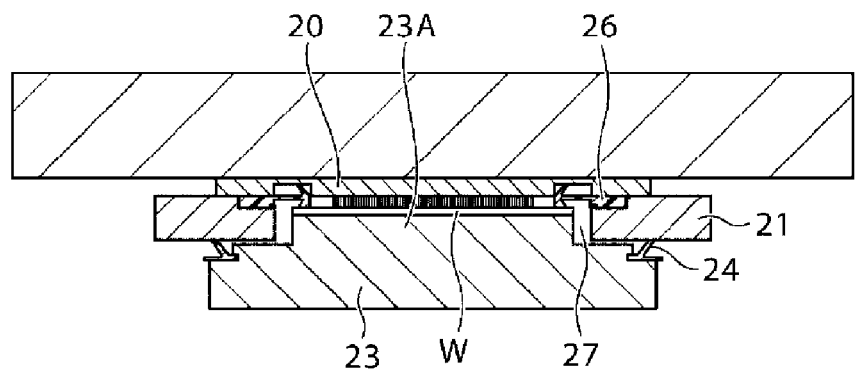
(B)
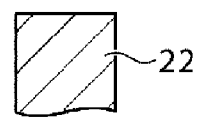

FIG. 9
(PRIOR ART)
(A)
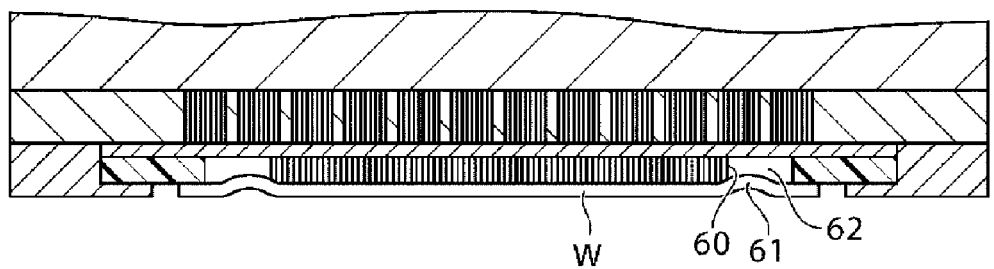
(B)
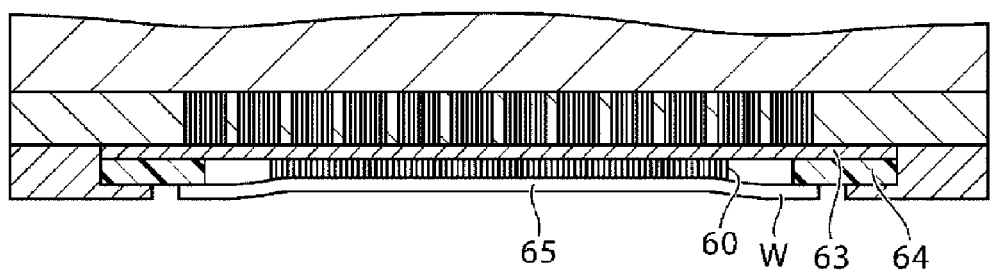

INTERFACE AND APPARATUS FOR INSPECTING ELECTRICAL CHARACTERISTICS OF WAFER

CROSS-REFERENCE TO RELATED APPLICATION

This application claims the benefit of Japanese Patent Application Nos. 2011-268673 and 2012-041555 filed on Dec. 8, 2011 and Feb. 28, 2012, respectively, the entire disclosures of which are incorporated herein by reference.

FIELD OF THE INVENTION

The present disclosure relates to a wafer inspection interface including a probe card and a wafer inspection apparatus.

BACKGROUND OF THE INVENTION

As a wafer inspection apparatus, there is known, for example, a burn—in inspection apparatus or a probe apparatus that inspects electrical characteristics of semiconductor devices formed on a wafer.

Typically, a probe apparatus includes a loader chamber for forming a wafer transfer region for transferring the wafer; and an inspection chamber for performing an inspection of electrical characteristics of a multiple number of semiconductor devices formed on the wafer. This probe apparatus is configured to inspect the electrical characteristics of the semiconductor devices by controlling various devices in the loader chamber and the inspection chamber under the control of a controller. The inspection chamber includes a mounting table, a probe card, and an alignment device. Here, the mounting table mounts thereon a wafer from the loader chamber and configured to be movable in X, Y, Z and θ directions. Further, the probe card is disposed above the mounting table, and the alignment device is configured to perform alignment (position adjustment) between a multiple number of probes (inspection needles) of the probe card and electrodes of the semiconductor devices formed on the wafer in cooperation with the mounting table. After aligning the wafer and the probe card by using the mounting table and the alignment device in cooperation, each probe of the probe card is brought into contact with each electrode of the wafer, thus inspecting electrical characteristics of the semiconductor devices formed on the wafer.

Since, however, a large space is required for providing the alignment device, the inspection chamber also occupies a large space three-dimensionally. Thus, a large space is required for installing the probe apparatus. In view of this problem, the present inventor has proposed removing the alignment device from the inspection chamber. In this case, a wafer and a wafer holding body for holding the wafer is aligned in an alignment chamber provided separately from the inspection chamber, and the wafer holding body is supported on an elevating body in the inspection chamber by using a positioning device (see, for example, Patent Document 1). Here, the elevating body is previously aligned with the probe card.

In this probe apparatus, the wafer on the wafer holding body moved up by the elevating body in the inspection chamber is attracted toward the probe card as a space formed between the wafer and the probe card is depressurized.

Patent Document 1: Specification of Japanese Patent Application No. 2010-207224

Since, however, the probes are not provided on the entire surface of the probe card facing the wafer, as shown in FIG. 9(A), a portion 61 of the wafer W which is not in contact with probes 60 is attracted toward a depressurized space 62. As a result, the wafer W may be bent, and a contact pressure between probes 60 and electrodes in the vicinity of this portion 61 would be increased, which causes a needle mark to be left on an electrode.

Further, a seal member 64 is provided between the wafer W and the probe card 63. When this seal member 64 is difficult to compress, only a central portion 65 of the wafer W would be attracted toward the depressurized space 62. As a result, the wafer W may be bent, and a contact pressure between probes 60 and electrodes in the vicinity of the seal member 64 may be decreased. Thus, it is difficult to accurately inspect the electrical characteristics of the semiconductor devices formed on the wafer.

All the aforementioned problems are caused for the reason that the wafer is bent because the wafer W partitions two spaces having different pressures.

BRIEF SUMMARY OF THE INVENTION

In view of the foregoing, illustrative embodiments provide a wafer inspection apparatus and a wafer inspection interface capable of preventing a wafer from being bent when inspecting electrical characteristics of a multiple number of semiconductor devices formed on a wafer.

In accordance with one aspect of an illustrative embodiment, there is provided a wafer inspection interface. The wafer inspection interface includes a probe card having a multiple number of probes on a surface thereof and the surface faces a wafer; a holding member configured to hold a periphery of the probe card; a table-shaped chuck member disposed to face the probe card with the wafer therebetween; a first seal member provided between the holding member and the chuck member to hermetically seal a first space surrounded by the holding member, the probe card and the chuck member; and a first depressurization path through which the first space is depressurized. Here, the wafer is disposed within the first space.

In the wafer inspection interface, the chuck member may include a wafer mounting surface for mounting the wafer thereon; a wafer attraction path that is opened to the wafer mounting surface, and configured to attract and hold the wafer onto the wafer mounting surface by depressurizing a gap between the wafer mounting surface and the wafer; and a path for opening to atmosphere that is opened to the wafer mounting surface and formed at an outer position than an opening position of the wafer attraction path on the wafer mounting surface, and communicates with the atmosphere.

The wafer inspection interface may further include a second seal member provided between the probe card and the wafer to hermetically seal a second space surrounded by the probe card and the wafer; and a second depressurization path through which the second space is depressurized. Further, the second space may be surrounded by the first space, and the wafer may be disposed within the second space.

In the wafer inspection interface, the first depressurization path and the second depressurization path may be joined.

In the wafer inspection interface, the wafer attraction path may include a ring-shaped attracting groove formed on the wafer mounting surface, and the path for opening to atmosphere may include a groove for opening to atmosphere and have a circular shape concentric with the attracting groove. Further, the groove for opening to atmosphere may be formed at an outer position than the attraction groove.

In the wafer inspection interface, the first space may be depressurized through the first depressurization path in a range from about −1 kPa to about −50 kPa, and the gap between the wafer and the wafer mounting surface may be depressurized through the wafer attraction path in a range from about −60 kPa to about −80 kPa.

In the wafer inspection interface, the second seal member may have flexibility in a direction of being compressed.

In the wafer inspection interface, a recess may be formed at a portion of the probe card that comes into contact with the second seal member.

In the wafer inspection interface, at least one of a portion of the second seal member that comes into contact with the wafer and a portion of the second seal member that comes into contact with the probe card may be inclined toward an opposite side to the second space.

In accordance with another aspect of the illustrative embodiment, there is provided a wafer inspection apparatus. The wafer inspection apparatus includes an inspection chamber for inspecting an electrical characteristic of a semiconductor device formed on a wafer; and a transfer device for loading and unloading the wafer into and from the inspection chamber. Further, the inspection chamber includes a wafer inspection interface. Here, the wafer inspection interface includes a probe card having a multiple number of probes on a surface thereof and the surface faces a wafer; a holding member configured to hold a periphery of the probe card; a table-shaped chuck member disposed to face the probe card with the wafer therebetween; a first seal member provided between the holding member and the chuck member to hermetically seal a first space surrounded by the holding member, the probe card and the chuck member; and a first depressurization path through which the first space is depressurized. Here, the wafer is disposed within the first space.

In the wafer inspection apparatus, the chuck member may include a wafer mounting surface for mounting the wafer thereon; a wafer attraction path that is opened to the wafer mounting surface, and configured to attract and hold the wafer onto the wafer mounting surface by depressurizing a gap between the wafer mounting surface and the wafer; and a path for opening to atmosphere that is opened to the wafer mounting surface and formed at an outer position than an opening position of the wafer attraction path on the wafer mounting surface, and communicates with the atmosphere.

In accordance with the illustrative embodiments, the first space surrounded and hermetically sealed by the first seal member, the holding member, the probe card and the chuck member is depressurized through the first depressurization path, and the wafer is placed in the first space. Accordingly, the chuck member is attracted to the holding member, thus pressurizing the wafer against the probe card. As a result, the wafer can be brought into contact with the probe card without partitioning two spaces having different pressures. Accordingly, when inspecting the semiconductor devices formed on the wafer, the wafer can be prevented from being bent.

BRIEF DESCRIPTION OF THE DRAWINGS

Non-limiting and non-exhaustive embodiments will be described in conjunction with the accompanying drawings. Understanding that these drawings depict only several embodiments in accordance with the disclosure and are, therefore, not to be intended to limit its scope, the disclosure will be described with specificity and detail through use of the accompanying drawings, in which:

FIG. 1 illustrates a schematic configuration of a wafer inspection apparatus in accordance with an illustrative embodiment: FIG. 1(A) is a plane view and FIG. 1(B) is a front view;

FIG. 4 provides enlarged cross sectional views schematically illustrating configurations in the vicinities of the seal rings in FIG. 2: FIG. 4(A) shows the vicinity of the inner seal ring and FIG. 4(B) shows the vicinity of the outer seal ring;

FIG. 5 provides process diagrams for describing processes for inspecting electrical characteristics of semiconductor devices on a wafer by using the wafer inspection interface shown in FIG. 2;

FIG. 6 provides process diagrams for describing processes for inspecting electrical characteristics of semiconductor devices on a wafer by using the wafer inspection interface shown in FIG. 2;

FIG. 9 provides cross sectional views schematically illustrating a configuration of a conventional wafer inspection interface: FIG. 9(A) shows a case where a portion of the wafer which is not in contact with a probe is bent and FIG. 9(B) shows a case where a central portion of the wafer is bent.

DETAILED DESCRIPTION OF THE INVENTION

Figure 2:
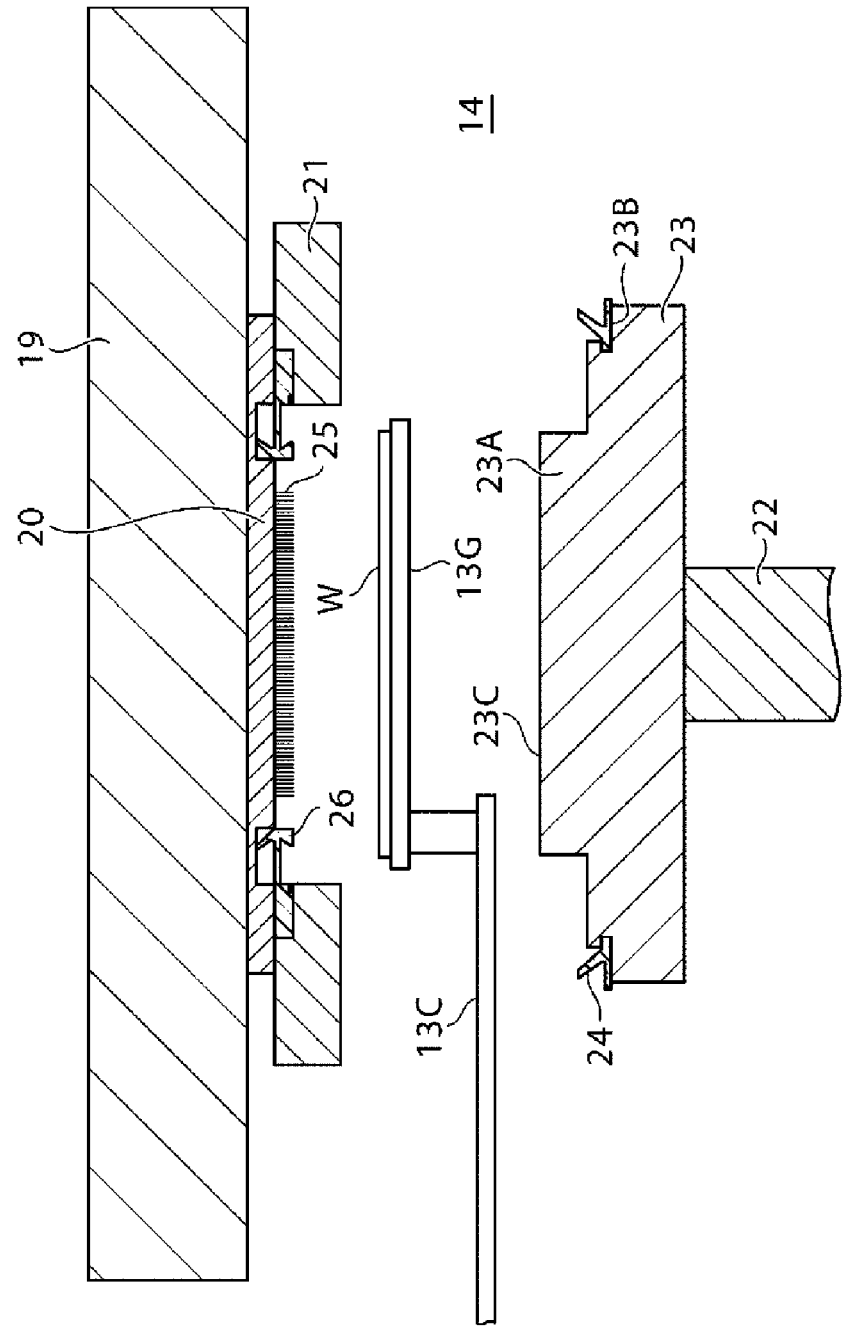
FIG. 2 is a cross sectional view schematically illustrating a configuration of a wafer inspection interface included in an inspection chamber of FIG. 1.

Hereinafter, illustrative embodiments will be described in detail with reference to the accompanying drawings.

FIG. 1 schematically illustrates a configuration of a wafer inspection apparatus in accordance with an illustrative embodiment. FIG. 1(A) is a plane view and FIG. 1(B) is a front view thereof.

As shown in FIGS. 1(A) and 1(B), a wafer inspection apparatus 10 includes a loading/unloading section S10, an alignment section S20, a transfer section S30, and an inspection section S40, which include a mounting device 11, an alignment chamber 12, a wafer transfer device 13, and an inspection chamber 14, respectively. A wafer W is loaded into or unloaded from a cassette, e.g., a FOUP (F) at the front of the wafer inspection apparatus 10 in the loading/unloading section S10. The alignment section S20 is provided on a right side of the loading/unloading section S10. In the transfer section S30, a wafer W is transferred along the loading/unloading section S10 and the alignment section S20. Further, the inspection section S40 is provided along the transfer section S30.

The wafer transfer device 13 includes, as illustrated in FIG. 1(B), a base 13A; a rotational body 13B; two vertically arranged arms, i.e., an upper arm 13C and a lower arm 13D; an elevating device 13E; a moving device 13F; and a pick 13G. The rotational body 13B is provided on the base 13A via a rotation shaft to be rotatable in forward and backward directions. The arms 13C and 13D are configured to be individually moved back and forth on the rotational body 13B in one direction. The elevating device 13E is configured to move the base 13A and the arms 13C and 13D up and down. The moving device 13F is configured to move these devices back and forth along the transfer section S30. Further, the pick 13G is provided at a leading end of the upper arm 13C (see FIG. 2).

In the wafer inspection apparatus 10, the wafer transfer device 13 transfers an uninspected wafer W into the alignment chamber 12 from a FOUP (F). In the alignment chamber 12, alignment of the wafer W with the pick 13G of the wafer transfer device 13 is performed. Then, the wafer transfer device 13 transfers the aligned wafer W into the inspection chamber 14. The inspection chamber 14 includes a wafer inspection interface 18. The wafer inspection interface 18 is configured to inspect electrical characteristics of semiconductor devices formed on the wafer W.

Further, the wafer transfer device 13 transfers an inspected wafer W from the inspection chamber 14 to a needle mark inspection device 17 provided in a needle mark inspection section S50 located on a left side of the mounting device 11 in FIG. 1. The needle mark inspection device 17 is configured to inspect a needle mark (i.e., a mark of a contact with a probe 25) on an electrode of the respective semiconductor devices on the inspected wafer W. Then, the wafer transfer device 13 loads the inspected wafer W into the FOUP (F) on the mounting device 11.

FIG. 2 is a cross sectional view schematically illustrating a configuration of the wafer inspection interface included in the inspection chamber of FIG. 1.

In FIG. 2, a wafer inspection interface 18 includes a head plate 19, a probe card 20, a fixing ring 21 (holding member), a rod-shaped lifter 22 and a table-shaped chuck top 23 (chuck member). The head plate 19 is provided at a ceiling portion of the inspection chamber 14 and is made of a plate-shaped member. The probe card 20 is disposed on a bottom surface of the head plate 19. The fixing ring 21 holds the periphery of the probe card 20 and fixes the probe card 20 to the head plate 19. The lifter 22 is arranged uprightly from a bottom of the inspection chamber 14 and is configured to be moved up and down. The chuck top 23 is provided on a top portion of the lifter 22. The chuck top 23 has a cross section of a protruding shape, and includes an upwardly protruding portion 23A; and a step-shaped portion 23B surrounding the protruding portion 23A and formed to be lower than the protruding portion 23A.

Before inspecting electrical characteristics of semiconductor devices formed on the wafer W, the pick 13G and the arm 13C on the wafer transfer device 13 is moved into the inspection chamber 14 and locates the wafer W between the probe card 20 and the chuck top 23. The chuck top 23 faces the probe card 20 with the wafer W positioned therebetween. Specifically, the protruding portion 23A faces the probe card 20, and the step-shaped portion 23B faces the fixing ring 21 that surrounds the periphery of the probe card 20. A flat top surface of the protruding portion 23A serves as a wafer mounting surface 23C.

The chuck top 23 has an outer seal ring 24 (first seal member) disposed on the step-shaped portion 23B. The outer seal ring 24 surrounds the protruding portion 23A. The probe card 20 has a multiple number of probes (inspection needles) 25 arranged on its surface facing the chuck top 23 (wafer W) to correspond to electrodes of the respective semiconductor devices formed on the wafer W. An inner seal ring 26 (second seal member) disposed to surround a region of the probe card 20 where the probes 25 are arranged is held between the fixing ring 21 and the probe card 20.

When inspecting the electrical characteristics of the semiconductor devices formed on the wafer W, the chuck top 23 is moved upward by the lifter 22 and brought into contact with the fixing ring 21 via the outer seal ring 24. At this time, the wafer W is located on the wafer mounting surface 23C of the chuck top 23 and brought into contact with the probe card 20 via the inner seal ring 26.

Figure 3:
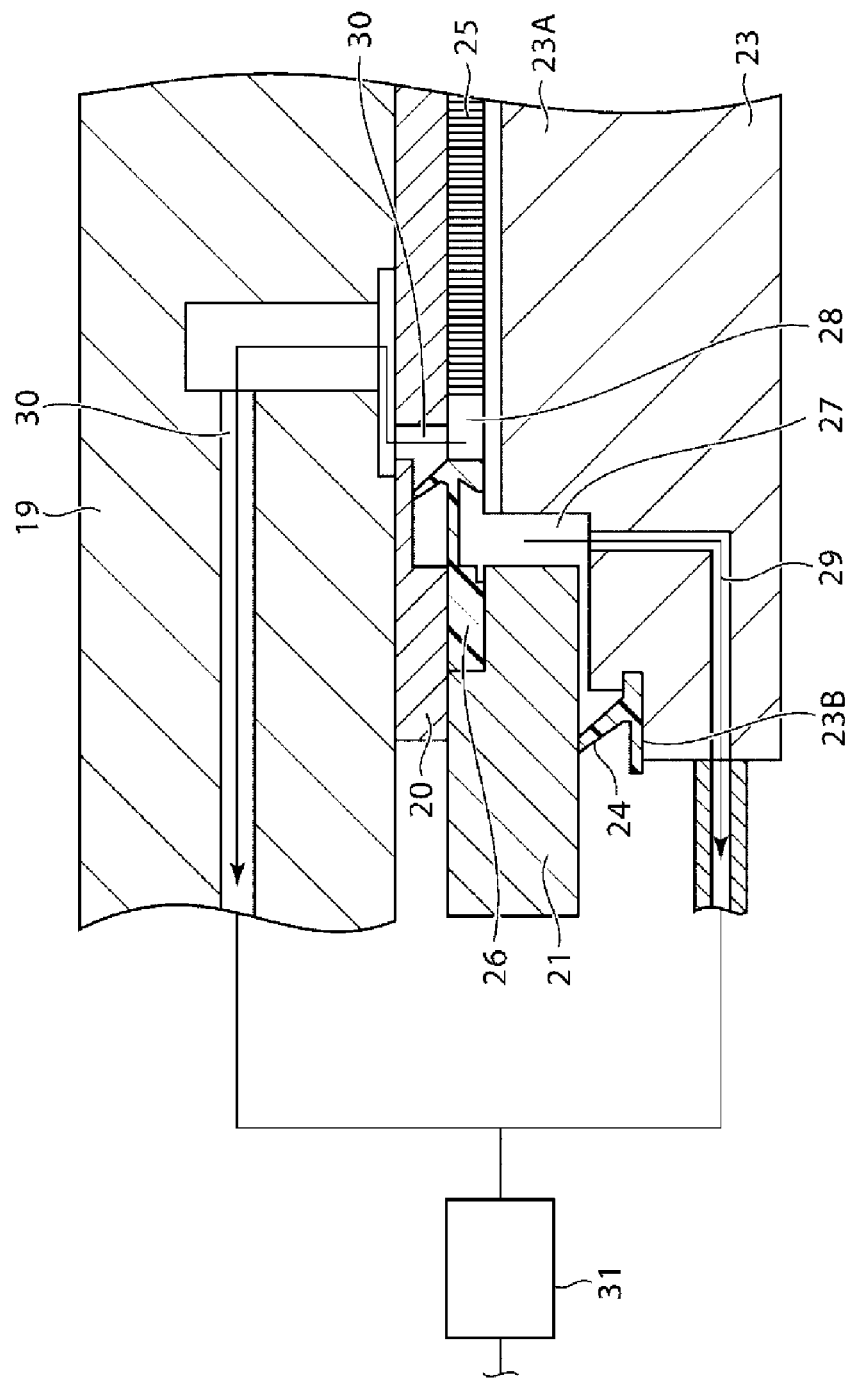
FIG. 3 is an enlarged cross sectional view illustrating a vicinity of an outer seal ring and an inner seal ring when inspecting electrical characteristics of semiconductor devices formed on a wafer.

FIG. 3 is an enlarged cross sectional view illustrating the vicinity of the outer seal ring and the inner seal ring when inspecting the electrical characteristics of the semiconductor devices formed on the wafer.

In FIG. 3, an outer space 27 (first space) is formed by the outer seal ring 24, the fixing ring 21, the chuck top 23 and the inner seal ring 26, and hermetically sealed against an atmosphere within the inspection chamber 14. An inner space 28 (second space) is formed by the inner seal ring 26, the probe card 20 and the wafer W, and hermetically sealed against the outer space 27.

The chuck top 23 has an outer depressurization path 29 (first depressurization path) opened toward the outer space 27. The probe card 20 and the head plate 19 have an inner depressurization path 30 (second depressurization path) opened toward the inner space 28. The outer depressurization path 29 and the inner depressurization path 30 are extended out of the chuck top 23 and the head plate 19, respectively, to be joined, and are connected to an exhaust device 31. The outer depressurization path 29 evacuates and depressurizes the outer space 27 along a direction indicated by an arrow in FIG. 3, and the inner depressurization path 30 evacuates and depressurizes the inner space 28 along a direction indicated by another arrow in FIG. 3.

If the outer space 27 is depressurized, the chuck top 23 is attracted toward the fixing ring 21, and, accordingly, the chuck top 23 is indirectly held by the fixing ring 21. Further, if the inner space 28 is depressurized, the wafer W is attracted toward the probe card 20, and, accordingly, the wafer W is indirectly held by the probe card 20. In this illustrative embodiment, if the outer space 27 is depressurized, since the chuck top 23 is attracted toward the fixing ring 21, the wafer W mounted on the wafer mounting surface 23C is pressed against the probe card 20 which is fastened by the fixing ring 21. If the inner space 28 is depressurized, since the wafer W itself is attracted toward the probe card 20, the electrodes of the respective semiconductor devices formed on the wafer W are securely brought into contact with the corresponding probes 25.

FIG. 4 provides enlarged cross sectional views schematically illustrating configurations in the vicinities of the seal rings in FIG. 2. FIG. 4(A) illustrates the vicinity of the inner seal ring, and FIG. 4(B) illustrates the vicinity of the outer seal ring.

In FIG. 4(A), the inner seal ring 26 includes a base 26A; a contact portion 26B (a portion brought into contact with the probe card); and a contact portion 26C (a portion brought into contact with the wafer). The base 26A has a substantially T-shaped cross section rotated by about 90 degrees, and is held between the fixing ring 21 and the probe card 20. The contact portion 26B is provided at a leading end of the base 26A to be protruded toward the probe card 20, and the contact portion 26C is provided at the leading end of the base 26A to be protruded toward the wafer W.

In the inner seal ring 26, both of the contact portion 26B and the contact portion 26C are inclined toward the opposite side to the inner space 28. However, the illustrative embodiment is not limited thereto, and at least one of the contact portion 26B and the contact portion 26C may be inclined toward an opposite side to the inner space 28. As will be described later, before the chuck top 23 is attracted toward the fixing ring 21, only the wafer W is brought into contact with the probe card 20 and attracted thereto. At this time, the inner space 28 is depressurized through the inner depressurization path 30, whereas the opposite side of the inner space 28 with respect to the inner seal ring 26 is under the atmosphere within the inspection chamber 14. Accordingly, the contact portion 26B and the contact portion 26C of the inner seal ring 26 are attracted toward the inner space 28, as indicated by a dashed line in FIG. 4(A). Since, however, the contact portion 26B and the contact portion 26C are both inclined to the opposite side to the inner space 28, the contact portion 26B and the contact portion 26C are attracted toward the inner space 28 while rotating about a joint portion between them and the base 26A. As a result, a leading end of the contact portion 26B and a leading end of the contact portion 26C are more firmly brought into contact with the probe card 20 and the wafer W, respectively (see the dashed line in FIG. 4(A)). Thus, when the wafer W is attracted to the probe card 20, even if only the inner space 28 is depressurized, the inner space 28 can be still hermetically sealed securely.

As for the contact portion 26C, a length from the leading end thereof to the joint portion with the base 26A is set to be a preset value, e.g., about 1.2 mm. Further, a recess 20A is formed at a portion of the probe card 20 to be brought into contact with the contact portion 26B. As for the contact portion 26B, a length from the leading end thereof to the joint portion with the base 26A is set to be a preset value, e.g., about 1.2 mm. Accordingly, the inner seal ring 26 has high flexibility in the direction of being compressed when the wafer W is attracted toward the probe card 20. As a result, it is possible to prevent the wafer W from being bent by a reaction force from the inner seal ring 26.

Referring to FIG. 4(B), the outer seal ring 24 includes a base 24A that has a substantially L-shaped cross section rotated by about 90 degrees, and is positioned on the step-shaped portion 23B. Further, the outer seal ring 24 includes a contact portion 24B protruded upward from the base 24A.

In the outer seal ring 24, the contact portion 24B is inclined toward the opposite side to the outer space 27. When the chuck top 23 is attracted toward the fixing ring 21, the outer space 27 is depressurized through the outer depressurization path 29, whereas the opposite side of the outer space 27 with respect to the outer seal ring 24 is under the atmosphere within the inspection chamber 14. Accordingly, the contact portion 24B of the outer seal ring 24 is attracted toward the outer space 27, as indicated by a dashed line in FIG. 4(B). Since, however, the contact portion 24B is inclined toward the opposite side to the outer space 27, the contact portion 24B is attracted toward the outer space 27 while rotating about a joint portion with the base 24A. As a result, a leading end of the contact portion 24B is more firmly brought into contact with the fixing ring 21 (see the dashed line in FIG. 4(B)). Accordingly, when the chuck top 23 is attracted toward the fixing ring 21, the outer space 27 can be still hermetically sealed securely.

As for the contact portion 24B, a length from the leading end thereof to the joint portion with the base 24A is set to be a preset value, e.g., about 1.2 mm. Accordingly, when the chuck top 23 is attracted toward the fixing ring 21, the outer seal ring 24 has high flexibility in the direction of being compressed. As a result, it is possible to prevent the chuck top 23 from being bent by a reaction force from the outer seal ring 24.

Now, a process for inspecting electrical characteristics of semiconductor devices on a wafer by using the wafer inspection interface of FIG. 2 will be explained.

FIGS. 5 and 6 provide process diagrams for illustrating a process for inspecting electrical characteristics of semiconductor devices on a wafer using the wafer inspection apparatus shown in FIG. 2.

First, an aligned wafer W is loaded into the inspection chamber 14 by the wafer transfer device 13. Then, the wafer W aligned with the pick 13G is positioned to face the probe card 20. At this time, the wafer transfer device 13 aligns the pick 13G with the probe card 20 by slightly moving the arm 13C (see FIG. 5(A)), so that the wafer W is aligned with the probe card 20.

Subsequently, the wafer transfer device 13 moves the pick 13G toward the probe card 20, so that the wafer W is brought into contact with the probe card 20. At this time, since the wafer W and the probe card 20 are previously aligned, each probe 25 of the probe card 20 comes into contact with each electrode of the semiconductor devices formed on the wafer W (see FIG. 5(B)).

As the wafer W is brought into contact with the probe card 20, the inner space 28 is formed by the inner seal ring 26, the probe card 20 and the wafer W. Then, the inner space 28 is depressurized through the inner depressurization path 30, so that the wafer W is attracted toward the probe card 20, and temporarily held thereby. Thereafter, the pick 13G is moved apart from the wafer W and retreated out of the inspection chamber 14 by the wafer transfer device 13 (see FIG. 5(C)).

Subsequently, the lifter 22 moves the chuck top 23 upward, so that the chuck top 23 is brought into contact with the fixing ring 21. At this time, since the protruding portion 23A of the chuck top 23 is protruded upward from the step-shaped portion 23B, the wafer mounting surface 23C comes into contact with the wafer W that is temporarily held by the probe card 20. Accordingly, the wafer W is located on the wafer mounting surface 23C (see FIG. 6(A)).

As the chuck top 23 is brought into contact with the fixing ring 21, the outer space 27 is formed by the inner seal ring 26, the fixing ring 21, the chuck top 23, and the outer seal ring 24. Then, the outer space 27 is depressurized through the outer depressurization path 29, so that the chuck top 23 is attracted toward the fixing ring 21, and indirectly held thereby. At this time, the chuck top 23 attracted toward the fixing ring 21 pressurizes the wafer W on the wafer mounting surface 23C to the probe card 20. Here, since the chuck top 23 has higher rigidity than the wafer W, the wafer W can be pressurized toward the probe card 20 uniformly.

Further, since the outer depressurization path 29 and the inner depressurization path 30 are joined and are connected to the exhaust device 31, an internal pressure of the outer space 27 and an internal pressure of the inner space 28 can be set to be the same pressure value when evacuating the outer space 27 and the inner space 28. As a result, deformation of the inner seal ring 26 that separates the outer space 27 and the inner space 28 or deformation of the chuck top 23 in contact with both the outer space 27 and the inner space 28 can be prevented. Afterward, the lifter 22 is moved downward and distanced apart from the chuck top 23 (see FIG. 6(B)).

Then, an electric current of a preset value is flown from each probe 25 to each electrode of the semiconductor devices, and an electrical characteristic of each semiconductor device is inspected. Then, the inspection process is finished.

In accordance with the wafer inspection apparatus 10, the outer space 27 surrounded and hermetically sealed by the outer seal ring 24, the fixing ring 21, the probe card 20 and the chuck top 23 is depressurized through the outer depressurization path 29, and the wafer W is placed within the inner space 28 surrounded by the outer space 27. Accordingly, when the chuck top 23 is attracted toward the fixing ring 21, the wafer W is pressurized to the probe card 20. In this way, since the wafer W can be brought into contact with the probe card 20 without partitioning two spaces having different pressures, it is possible to prevent the wafer W from being bent when inspecting the electrical characteristics of the semiconductor devices formed on the wafer W.

Further, in the wafer inspection apparatus 10, the inner space 28 surrounded and hermetically sealed by the inner seal ring 26, the probe card 20 and the wafer W is depressurized through the inner depressurization path 30. Accordingly, before the outer space 27 is formed by bringing the chuck top 23 into contact with the fixing ring 21 via the outer seal ring 24, the wafer W can be attracted toward and temporarily held by the probe card 20.

In accordance with the present illustrative embodiment, the outer seal ring 24 and the inner seal ring 26 have been described to have the substantially L-shaped cross section and the substantially T-shaped cross section, respectively. However, it may be possible to use an O-ring having a circular cross section as the outer and inner seal rings in order to reduce costs.

Furthermore, although the chuck top 23 is disposed in each inspection chamber 14, it is possible to provide only one chuck top 23 as the wafer inspection apparatus 10 at a place separated from the inspection chambers 14. In this case, when inspecting electrical characteristics of semiconductor devices on the wafer W, only the chuck top 23 may be loaded into the inspection chamber 14 by the wafer transfer device 13 and may be moved up toward the fixing ring 21 by the wafer transfer device 13. With this configuration, it is not necessary to provide the chuck top 23 or the lifter 22 in each inspection chamber 14, so that the size of each inspection chamber 14 can be further decreased.

The electrical characteristics of the semiconductor devices on the wafer may be inspected by using the wafer inspection apparatus at a temperature range from a high temperature of, e.g., about 90° C. to a low temperature of, e.g., about −30° C. In a chuck member of a wafer inspection interface to be used for inspecting the electrical characteristics, a temperature controller for controlling a temperature of a wafer is embedded. The temperature controller may be formed by a heat transfer heater for heating, a chiller for cooling, or the like.

In the wafer inspection interface including the chuck member having the temperature controller therein, in order to improve a heat conduction efficiency between a wafer mounting surface of the chuck member and a wafer mounted on the wafer mounting surface, the wafer and the wafer mounting surface need to be brought into firm contact with each other. Typically, the chuck member includes a wafer attracting/holding unit configured to attract and hold the wafer onto the wafer mounting surface by depressurizing a gap between the wafer and the wafer mounting surface. By way of example, the wafer attracting/holding unit may include a wafer attracting groove formed on the wafer mounting surface of the chuck member and a suction device connected to the wafer attracting groove via a connection path.

In the wafer inspection apparatus (see FIG. 2) in accordance with the above-described illustrative embodiment, however, in order to prevent the wafer W from being bent and to allow the wafer W and the probes 25 of the probe card 20 to be brought into firm contact with each other, the outer space 27 surrounded by the fixing ring 21, the probe card 20 and the chuck top 23 is maintained in a depressurized state. Accordingly, if the outer space 27, the depressurization path therefor and so forth shown in the illustrative embodiment of FIG. 2 are applied to a wafer inspection interface including the chuck member having the temperature controller therein, the following problems may be caused if a gap between the wafer and the wafer mounting surface is formed.

That is, an attracting pressure for attracting and holding the wafer W onto the wafer mounting surface 23C is, for example, about −80 kPa, and the depressurization level is much higher than that of the internal pressure of the outer space 27, e.g., about −2 kPa. Accordingly, if there is a gap between the wafer W and the wafer mounting surface 23C, the outer space 27 may be also depressurized by the depressurization for attracting and holding the wafer W onto the wafer mounting surface 23C. In such a case, it is not possible to control the internal pressure of the outer space 27 by the exhaust device 31. As a result, for example, the internal pressure of the outer space 27 may be highly decreased and, thus, a contact pressure between the probe card 20 and the wafer W may be excessively increased. Accordingly, the probes 25 of the probe card 20 may be damaged.

Further, since the wafer and the wafer mounting surface of the chuck member are both made of hard materials, a gap may be easily generated on the interface therebetween. The gap may be generated due to a foreign substance between the wafer and the wafer mounting surface.

In order to solve these problems, the present inventor has proposed a chuck member including a wafer mounting surface, a wafer attraction path and a path for opening to atmosphere. The mounting surface is configured to mount thereon a wafer. The wafer attraction path is opened to the wafer mounting surface, and the wafer is attracted and held onto the wafer mounting surface through the wafer attraction path by depressurizing a gap between the wafer mounting surface and the wafer. The path for opening to atmosphere communicates with the atmosphere, and is formed outside of an opening position of the wafer attraction path on the wafer mounting surface. With this configuration, when a gap is formed between the wafer and the wafer mounting surface, the exterior atmosphere is suctioned by the depressurization for attracting and holding the wafer. Thus, even when there occurs depressurization for attracting and holding the wafer, it is possible to prevent an adverse influence upon the internal pressure of the outer space 27.

Figure 7:
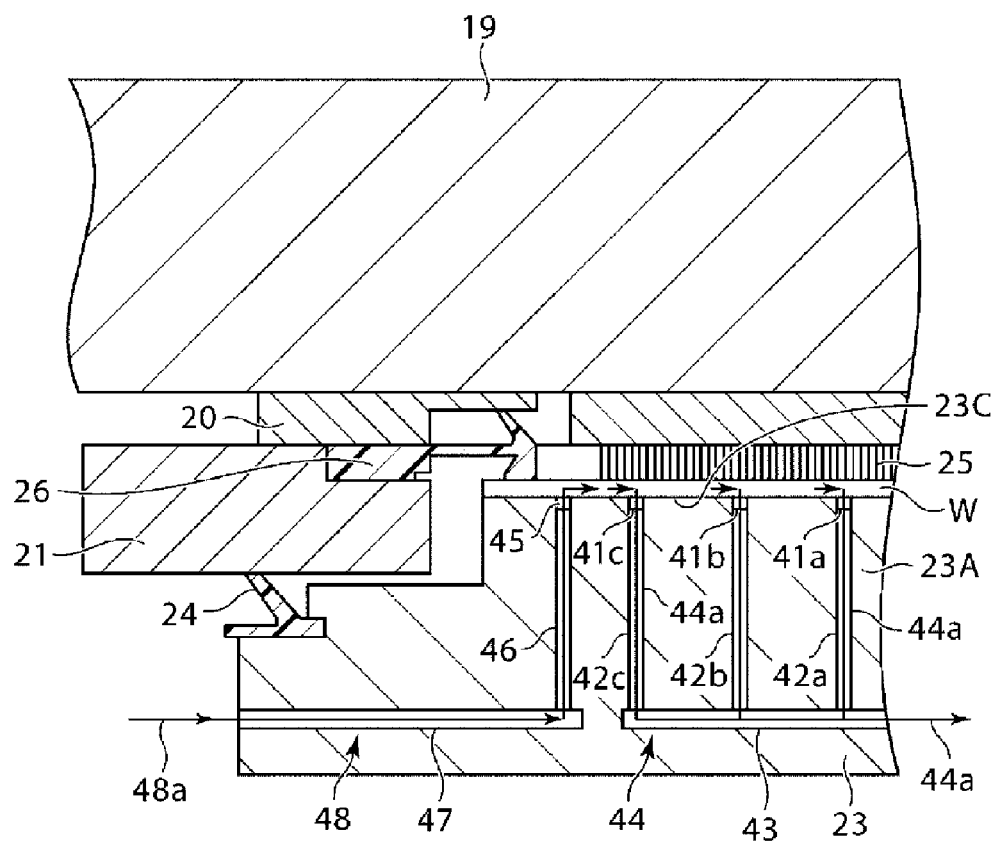
FIG. 7 is a cross sectional view schematically illustrating a wafer inspection interface of a wafer inspection apparatus in accordance with another illustrative embodiment.
Figure 8:
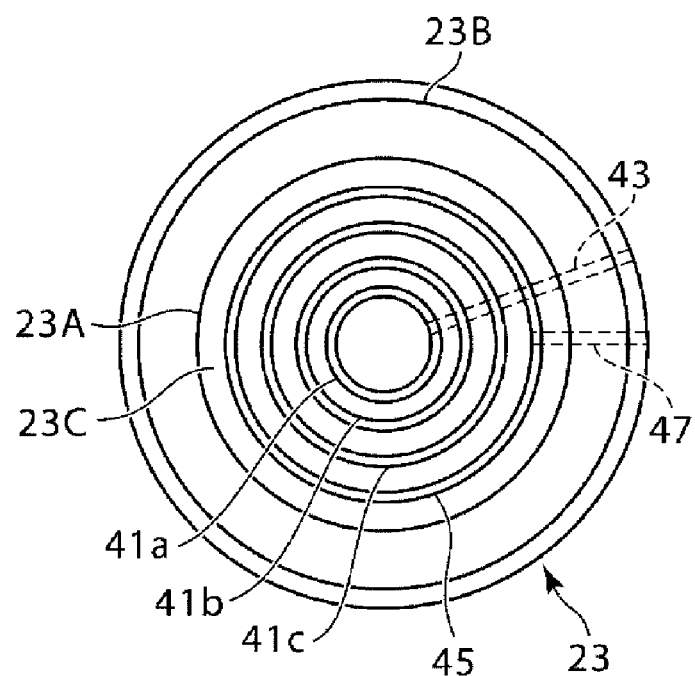
FIG. 8 is a plane view of a chuck top of FIG. 7.

FIG. 7 is a cross sectional view schematically illustrating a wafer inspection interface of a wafer inspection apparatus in accordance with another illustrative embodiment. FIG. 8 is a plane view of a chuck top 23 of FIG. 7. A configuration and an operation of this wafer inspection interface 38 are basically the same as those of the above-described wafer inspection interface shown in FIG. 2. Accordingly, like parts will be assigned like reference numerals, and redundant description thereof will be omitted while only distinctive parts and operations will be elaborated in accordance with another illustrative embodiment.

In FIGS. 7 and 8, a multiple number of, e.g., three wafer attracting grooves 41a, 41b and 41c are concentrically formed on a wafer mounting surface 23C, i.e., a flat top surface of a protruding portion 23A of the chuck top 23. The wafer attracting grooves 41a to 41c are circular grooves (when viewed from the top). Further, each of the wafer attracting grooves 41a to 41c has a width of, e.g., about 0.5 mm and a depth of, e.g., about 0.5 mm. Moreover, the wafer attracting grooves 41a to 41c are connected to a common depressurization path 43 via connection paths 42a to 42c, respectively, each of which has a cross section of, e.g., about 0.5 φ. The depressurization path 43 is formed of a pipeline having a cross section of, e.g., about 2.5 φ and is connected to a non-illustrated depressurization device. The wafer attracting grooves 41a to 41c, the connection paths 42a to 42c, and the depressurization path 43 form a wafer attraction path 44.

Further, a groove 45 for opening to atmosphere is formed at an outer position than the outermost wafer attracting groove 41c to be concentric with the wafer attracting groove 41c. The groove 45 for opening to atmosphere is connected with an atmosphere path 47 via the connection path 46. The atmosphere path 47 is extended through, e.g., a sidewall of a step-shaped portion 23B of the chuck top 23 and communicates with the atmosphere. The groove 45 for opening to atmosphere, the connection path 46 and the atmosphere path 47 form a path 48 for opening to atmosphere. The groove 45 for opening to atmosphere is located at an outer position than an opening position of the wafer attracting groove 41c on a wafer mounting surface 23C and at an inner position than a periphery surface of a protruding portion 23A of the chuck top 23 in contact with an outer space 27.

Now, a process for inspecting electrical characteristics of semiconductor devices on a wafer W by using the wafer inspection apparatus including the wafer inspection interface having the above-described configuration will be explained.

In this another illustrative embodiment, semiconductor devices is inspected in the same manner as described in FIGS. 5 and 6. That is, a wafer W is loaded into the inspection chamber 14 by the wafer transfer device 13, and after the wafer W and the probe card 20 are aligned with each other, the wafer W is brought into contact with the probe card 20. Accordingly, each probe 25 of the probe card 20 is brought into contact with each electrode of the semiconductor devices formed on the wafer W.

Then, the inner space 28 formed by the inner seal ring 26, the probe card 20 and the wafer W as a result of the contact between the wafer W and the probe card 20 is depressurized, and the wafer W is temporarily held by the probe card 20. After the wafer W is temporarily held, the wafer transfer device 13 is retreated from the inspection chamber 14. Then, the lifter 22 (see FIG. 6) is moved upward to bring the chuck top 23 into contact with the fixing ring 21. At this time, the protruding portion 23A of the chuck top 23 comes into contact with the wafer W temporarily held by the probe card 20, and the wafer W is supported on the flat top surface of the protruding portion 23A, i.e., on the wafer mounting surface 23C.

Thereafter, the outer space 27 formed by the inner seal ring 26, the fixing ring 21, the chuck top 23, and the outer seal ring 24 as a result of the contact between the chuck top 23 and the fixing ring 21 is depressurized. Accordingly, the chuck top 23 is attracted toward the fixing ring 21, and the wafer W is uniformly pressed against the probe card 20 by the chuck top 23.

At this time, the outer space 27 and the inner space 28 are depressurized by a common exhaust device 31. As a result, the outer space 27 and the inner space 28 have a same pressure value. Accordingly, it is possible to prevent the inner seal ring 26 and the chuck top 23 from being deformed.

Subsequently, a gap between the wafer W and the wafer mounting surface 23C is depressurized to, e.g., about −80 kPa through the wafer attraction path 44 that is formed of the wafer attracting grooves 41a to 41c opened on the wafer mounting surface 23C of the chuck top 23, the connection paths 42a to 42c and the depressurization path 43. As a result, the wafer W is attracted to and held on the wafer mounting surface 23C.

Here, a gap may be formed on an interface between the wafer W and the wafer mounting surface 23C if the wafer W and the wafer mounting surface 23C are made of hard materials or a foreign substance is provided therebetween. Even in such a case, since the groove 45 for opening to atmosphere is formed at the outer position than the wafer attracting groove 41c, when depressurizing the gap through the wafer attraction path 44 in the direction of an arrow 44a, the atmosphere flowing through the path 48 for opening to atmosphere in the direction of an arrow 48a via the gap between the wafer W and the wafer mounting surface 23C is suctioned. Accordingly, an internal pressure of the outer space 27 can be controlled efficiently by the exhaust device 31 without being adversely affected by the depressurization for attracting and holding the wafer W onto the wafer mounting surface 23C.

After the wafer W is attracted to and held on the wafer mounting surface 23C, the temperature of the wafer W is adjusted to a preset temperature, e.g., about 90° C. or about −30° C. by using a non-illustrated temperature controller embedded in the chuck top 23. Thereafter, an electric current of a preset value is flown from each probe 25 of the probe card 20 to the electrode of the semiconductor device and the electrical characteristics of the semiconductor devices are inspected at the desired temperature. Then, the inspection is finished.

In accordance with this another illustrative embodiment, the groove 45 for opening to atmosphere, which communicates with the atmosphere via the connection path 46 and the atmosphere path 47, is formed at the outer position than the wafer attracting grooves 41a to 41c formed on the wafer mounting surface 23C of the chuck top 23. Thus, even if a gap is formed between the wafer W and the wafer mounting surface 23C for the reason that the wafer and the wafer mounting surface 23C are both made of hard materials or a foreign substance is provided therebetween, the atmosphere is suctioned through the path 48 for opening to atmosphere by the depressurization caused by this gap. Accordingly, even if a gap is formed between the wafer W and the wafer mounting surface 23C, the depressurization for attracting and holding the wafer W onto the wafer mounting surface 23C may not have an adverse influence upon the internal pressure of the outer space 27. Further, the internal pressure of the outer space 27 can be effectively and stably controlled by the exhaust device 31. Thus, an adverse effect caused by over-depressurization of the outer space 27 can be prevented. For example, the wafer W can be prevented from being brought into contact with the probes 25 of the probe card 20 with an excessively high pressure and from being damaged.

In this another illustrative embodiment, the internal pressure of the inner space 28 and the outer space 27, in which the wafer W is placed, ranges from, e.g., about −1 kPa to about −50 kPa. A pressure for attracting and holding the wafer W onto the wafer mounting surface 23C ranges from, e.g., about −60 kPa to about −80 kPa.

In accordance with the another illustrative embodiment, the atmosphere path 47 of the path 48 for opening to atmosphere and the depressurization path 43 of the wafer attraction path 44 are formed on the same cross section (see FIG. 7). However, the illustrative embodiment may not be limited thereto. By way of example, the atmosphere path 47 and the depressurization path 43 may be moved along a circumferential direction of the chuck top 23 by a preset angle. In that case, the atmosphere path 47 and the depressurization path 43 may be formed on different cross sections.

In accordance with the another illustrative embodiment, although the three wafer attracting grooves 41a to 41c having concentric circle shapes are formed, the number of the wafer attracting grooves is not limited thereto. By way of example, one or two wafer attracting grooves may be formed, or four or more wafer attracting grooves may also be formed.

In the another illustrative embodiment, the internal pressure of the outer space 27 and the inner space 28 may be adjusted depending on the number of the probes 25 of the probe card 20. That is, the internal pressure of the outer space 27 and the inner space 28 is adjusted such that a pressing force of each probe 25 against the electrode of the semiconductor device on the wafer W becomes, e.g., about 5 grams to about 10 grams when the probe 25 comes into contact with the electrode of the semiconductor device.

Here, if the number of the probes 25 of the probe card 20 is, e.g., about 3000, the internal pressure of the outer space 27 and the inner space 28 is adjusted such that a total pressing force by which the probe card 20 presses the wafer W becomes, e.g., about 5 g×3000/1000=about 15 kg.

Further, if the probe card 20 has a circular plate shape of about 330 mm φ, a set internal pressure of the outer space 27 and the inner space 28 for obtaining the total pressing force of about 15 kg is calculated as about 15 kgf×9.8/(π×(330/2)²) =about 0.00172 MPa=about 1.72 kPa.

Accordingly, in accordance with another illustrative embodiment, the internal pressure of the outer space 27 and the inner space 28 is controlled to, e.g., about −1.72 kPa.

Here, a weight of the probe card 20 or a load necessary for the bending of the inner seal ring 26 and the outer seal ring 24 may be added to 15 kg as a compensation value.

While various aspects and embodiments have been described herein, other aspects and embodiments will be apparent to those skilled in the art. The various aspects and embodiments disclosed herein are not intended to be limiting and various modifications may be made without departing from the scope of the disclosure.

What is claimed is:

1. A wafer inspection interface comprising:
    a probe card having a multiple number of probes on a surface thereof, the surface facing a wafer;
    a holding member configured to hold a periphery of the probe card;
    a table-shaped chuck member disposed to face the probe card with the wafer therebetween;
    a first seal member provided between the holding member and the chuck member to hermetically seal a first space surrounded by the holding member, the probe card and the chuck member;
    a first depressurization path through which the first space is depressurized;
    a second seal member provided between the probe card and the wafer to hermetically seal a second space surrounded by the probe card and the wafer; and
    a second depressurization path through which the second space is depressurized,
    wherein the wafer is disposed within the first space, and the second space is surrounded by the first space, and the wafer is disposed within the second space.

2. The wafer inspection interface of claim 1, wherein the chuck member comprises:
    a wafer mounting surface for mounting the wafer thereon;
    a wafer attraction path that is opened to the wafer mounting surface, and configured to attract and hold the wafer onto the wafer mounting surface by depressurizing a gap between the wafer mounting surface and the wafer; and
    a path for opening to atmosphere that is opened to the wafer mounting surface and formed at an outer position than an opening position of the wafer attraction path on the wafer mounting surface, and communicates with the atmosphere.

3. The wafer inspection interface of claim 2, wherein the first depressurization path and the second depressurization path are joined.

4. The wafer inspection interface of claim 2, wherein the wafer attraction path includes a ring-shaped attracting groove formed on the wafer mounting surface, the path for opening to atmosphere includes a ring-shaped groove for opening to atmosphere, and the ring-shaped attracting groove and the ring-shaped groove for opening to atmosphere are concentric with each other, and the groove for opening to atmosphere is formed at an outer position than the attraction groove.

5. The wafer inspection interface of claim 2, wherein the first space is depressurized through the first depressurization path in a range from about −1 kPa to about −50 kPa, and
    the gap between the wafer and the wafer mounting surface is depressurized through the wafer attraction path in a range from about —60 kPa to about —80 kPa.

6. The wafer inspection interface of claim 1,
    wherein the first depressurization path and the second depressurization path are joined.

7. The wafer inspection interface of claim 1,
    wherein the second seal member has flexibility in a direction of being compressed.

8. The wafer inspection interface of claim 1,
    wherein a recess is formed at a portion of the probe card that comes into contact with the second seal member.

9. The wafer inspection interface of claim 1,
    wherein at least one of a portion of the second seal member that comes into contact with the wafer and a portion of the second seal member that comes into contact with the probe card is inclined toward an opposite side to the second space.

10. A wafer inspection apparatus including an inspection chamber for inspecting an electrical characteristic of a semiconductor device formed on a wafer and a transfer device for loading and unloading the wafer into and from the inspection chamber,
    wherein the inspection chamber includes therein a wafer inspection interface,
    the wafer inspection interface includes:
    a probe card having a multiple number of probes on a surface thereof, the surface facing a wafer;
    a holding member configured to hold a periphery of the probe card;
    a table-shaped chuck member disposed to face the probe card with the wafer therebetween;
    a first seal member provided between the holding member and the chuck member to hermetically seal a first space surrounded by the holding member, the probe card and the chuck member;
    a first depressurization path through which the first space is depressurized;
    a second seal member provided between the probe card and the wafer to hermetically seal a second space surrounded by the probe card and the wafer; and
    a second depressurization path through which the second space is depressurized,
    wherein the wafer is disposed within the first space, and the second space is surrounded by the first space, and the wafer is disposed within the second space.

11. The wafer inspection apparatus of claim 10,
    wherein the chuck member comprises:
    a wafer mounting surface for mounting the wafer thereon;
    a wafer attraction path that is opened to the wafer mounting surface, and configured to attract and hold the wafer onto the wafer mounting surface by depressurizing a gap between the wafer mounting surface and the wafer; and
    a path for opening to atmosphere that is opened to the wafer mounting surface and formed at an outer position than an opening position of the wafer attraction path on the wafer mounting surface, and communicates with the atmosphere.

* * * * *